(12) United States Patent
Miyairi

(10) Patent No.: US 8,721,131 B2
(45) Date of Patent: May 13, 2014

(54) LIGHTING UNIT

(75) Inventor: Hiroshi Miyairi, Yokohama (JP)

(73) Assignee: Nichia Corporation, Anan-shi (JP)

( * ) Notice: Subject to any disclaimer, the term of this patent is extended or adjusted under 35 U.S.C. 154(b) by 284 days.

(21) Appl. No.: 12/682,014

(22) PCT Filed: Oct. 2, 2008

(86) PCT No.: PCT/JP2008/067909
§ 371 (c)(1),
(2), (4) Date: Apr. 7, 2010

(87) PCT Pub. No.: WO2009/048011
PCT Pub. Date: Apr. 16, 2009

(65) Prior Publication Data
US 2010/0238660 A1    Sep. 23, 2010

(30) Foreign Application Priority Data

Oct. 12, 2007    (JP) .................................. 2007-266152

(51) Int. Cl.
*F21V 7/00*    (2006.01)
(52) U.S. Cl.
USPC ........... 362/346; 362/347; 362/348; 362/349; 362/217.05
(58) Field of Classification Search
USPC ..................... 362/346–349, 217.05
See application file for complete search history.

(56) References Cited

U.S. PATENT DOCUMENTS

| | | | |
|---|---|---|---|
| 4,218,727 A | 8/1980 | Shemitz et al. | |
| 4,349,866 A | 9/1982 | Molnar | |
| 4,929,866 A * | 5/1990 | Murata et al. | 362/310 |
| 5,556,191 A | 9/1996 | Maassen | |
| 6,504,301 B1* | 1/2003 | Lowery | 362/800 |
| 6,603,243 B2* | 8/2003 | Parkyn et al. | 362/231 |
| 7,008,079 B2* | 3/2006 | Smith | 362/235 |
| 2002/0149942 A1* | 10/2002 | Suehiro | 362/298 |
| 2003/0156416 A1* | 8/2003 | Stopa et al. | 362/294 |
| 2004/0136196 A1* | 7/2004 | Akiyama | 362/487 |
| 2005/0007756 A1* | 1/2005 | Yu et al. | 362/31 |
| 2006/0101757 A1* | 5/2006 | Tsuzuki et al. | 52/405.3 |
| 2006/0125716 A1 | 6/2006 | Wong et al. | |
| 2006/0262554 A1 | 11/2006 | Mok et al. | |
| 2007/0133213 A1* | 6/2007 | Peck | 362/341 |
| 2007/0153530 A1 | 7/2007 | Czajkowski | |
| 2007/0195518 A1* | 8/2007 | Tanaka | 362/125 |

FOREIGN PATENT DOCUMENTS

| | | |
|---|---|---|
| CN | 1808714 A | 7/2006 |
| DE | 102006013856 A1 | 10/2007 |
| JP | S54-161768 A | 12/1979 |
| JP | H01-251502 A | 10/1989 |
| JP | 07-025508 U | 5/1995 |
| JP | H08-095503 A | 4/1996 |

(Continued)

OTHER PUBLICATIONS

Supplementary European Search Report of the corresponding European Application No. 08837004.4, dated Dec. 20, 2012.

*Primary Examiner* — William Carter

(74) *Attorney, Agent, or Firm* — Global IP Counselors, LLP

(57) ABSTRACT

A lighting unit comprises a slender substrate; a plurality of semiconductor light sources arranged in a row in the lengthwise direction on the substrate; and a light reflector disposed along one long side of the substrate, the light reflector has a multi-reflector in which a plurality of small pieces are combined.

11 Claims, 3 Drawing Sheets

(56) References Cited

FOREIGN PATENT DOCUMENTS

| | | |
|---|---|---|
| JP | H08-510591 A | 11/1996 |
| JP | H10-188613 A | 7/1998 |
| JP | H11-161198 A | 6/1999 |
| JP | 2002-299697 A | 10/2002 |
| JP | 2006-173604 A | 6/2006 |
| JP | 2006-332665 A | 12/2006 |
| JP | 2007-167376 A | 7/2007 |
| JP | 2007-175130 A | 7/2007 |
| TW | 200643567 A | 12/2006 |

* cited by examiner

LIGHTING UNIT

CROSS-REFERENCE TO RELATED APPLICATIONS

This national phase application claims priority to Japanese Patent No. 2007-266152 filed on Oct. 12, 2007. The entire disclosure of Japanese Patent No. 2007-266152 is incorporated herein by reference.

TECHNICAL FIELD

The present invention relates to a lighting unit that makes use of semiconductor light sources, and more particularly relates to a lighting unit in which a plurality of semiconductor light sources are installed in a line.

BACKGROUND ART

Linear lighting units in which a light emitting diode or other such semiconductor light source is used have been proposed in recent years as lighting units that are an alternative to fluorescent lamps. For instance, in order to increase the luminous flux of light, a lighting unit has been disclosed which comprises a plurality of LED chips mounted along the lengthwise direction of a substrate, and a transparent resin part that is substantially semicylindrical or hog-backed and is formed so as to integrally cover these LED chips entirely. For example, see Japanese published unexamined patent application 2002-299697.

However, because of its narrow illumination range, the above-mentioned lighting unit was not suited to lighting applications in which a wide range is to be uniformly illuminated.

SUMMARY

The present invention provides a light unit which can uniformly illuminate within a wide range.

A lighting unit of one aspect of the invention includes a slender substrate, a plurality of semiconductor light sources arranged in a row in the lengthwise direction on the substrate, and a light reflector disposed along one long side of the substrate.

The light reflector has a multi-reflector in which a plurality of small pieces is combined.

It is preferable that the layout angles of the plurality of small pieces are adjusted so that light from the semiconductor light sources can be taken out as reflected light having different optical axes. Also, it is preferable that the plurality of small pieces are designed so that the farther away a small piece is disposed from the semiconductor light sources, the larger is its surface area and the longer is its focal distance.

The light reflector has preferably side reflectors that protrude between the plurality of semiconductor light sources.

Further, it is preferable that the lighting unit comprises a cover that has a light diffusing effect, on the other long side of the substrate.

The lighting unit of the present invention is a slender lighting unit having a multi-reflector in which a plurality of small pieces are combined, so optical characteristics on a par with those of a fluorescent lamp are maintained in the lengthwise direction, while high luminosity can be obtained even at locations away from the lighting unit.

DETAILED DESCRIPTION OF THE PREFERRED EMBODIMENTS

Embodiments of the light emitting device of the present invention will now be described in detail.

Embodiment 1

Figure 1A:
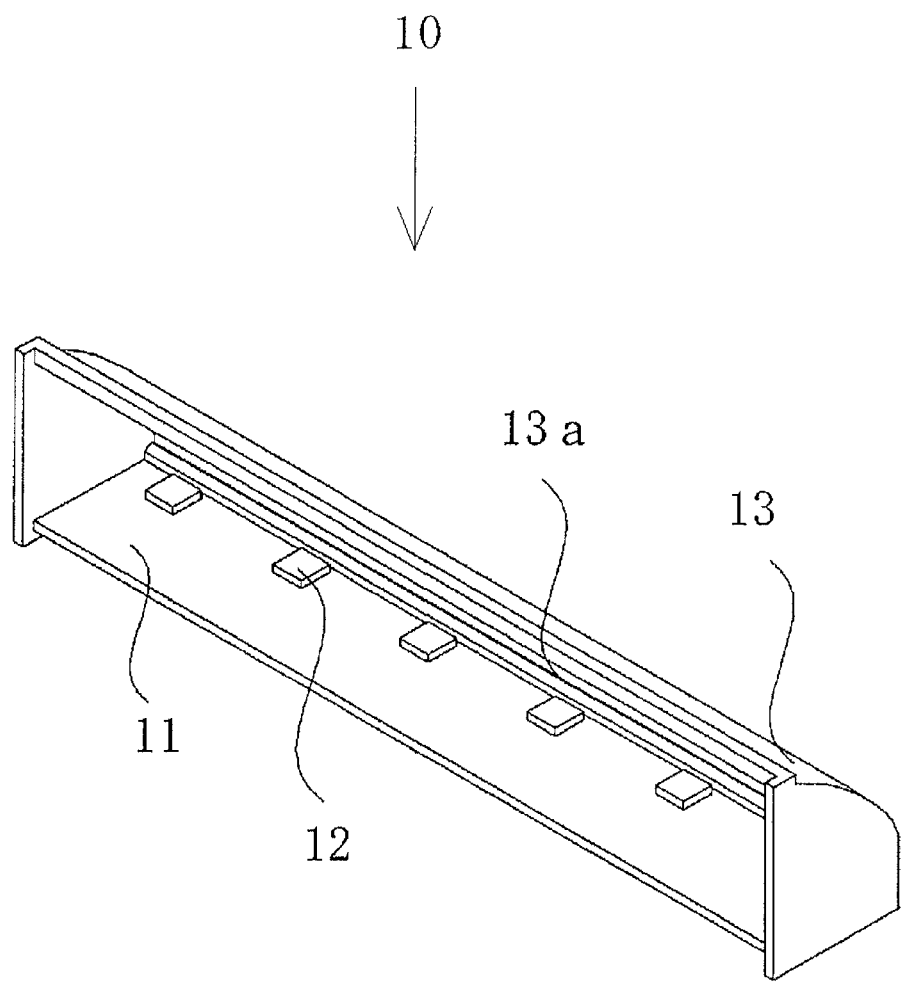
FIG. 1A is a schematic oblique view from the upper face side of the light unit according to a present invention.
Figure 1B:
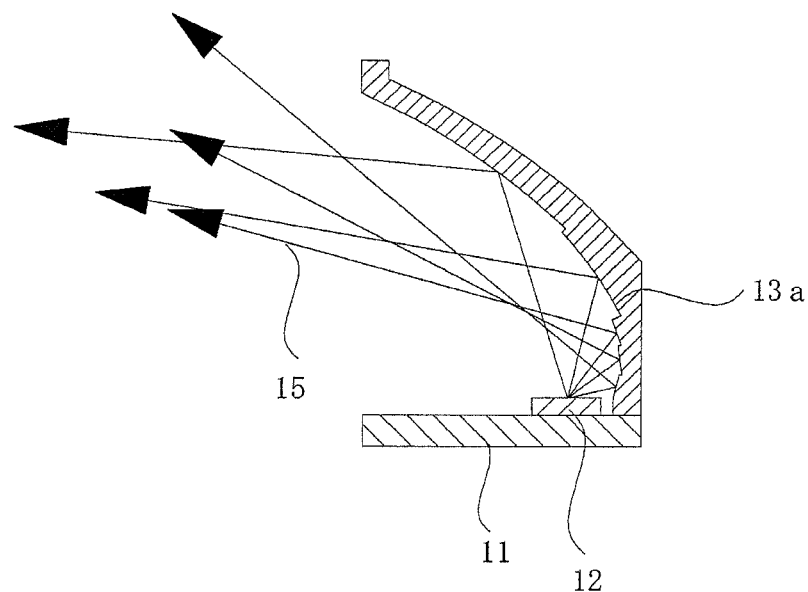
FIG. 1B is a schematic cross section in the direction of the front short side.

FIG. 1A is a schematic oblique view from the upper face side, and FIG. 1B is a schematic cross section in the direction of the short side of the substrate. As shown in these drawings, the lighting unit 10 of this embodiment mainly comprises a slender substrate 11, a plurality of semiconductor light sources 12 arranged in a row in the lengthwise direction on the substrate, and a light reflector 13 disposed on the substrate along one long side.

The substrate 11 is formed so that it extends in the lengthwise direction, and the plurality of semiconductor light sources 12 are arranged in a row on the upper face side of the substrate 11. The substrate 11 is a substrate with a configuration that is known in this field, such as having wiring or a wiring pattern for causing the semiconductor light sources 12 to emit light, on its top face and on its bottom face that is opposite the top face, and having different elements installed. The material of the substrate is preferably one with a high thermal conductivity, and a glass epoxy substrate or an alumina substrate can be used preferably. When a substrate with unfavorable thermal conductivity is used, a metal substrate with good thermal conductivity is preferably joined to the bottom face side of the substrate 11. It is also preferable for there to be a thermally conductive sheet (not shown) between the substrate 11 and the metal substrate. This thermally conductive sheet has thermal conductivity of about 1 W/(m·K) or higher, for example, and preferably is insulating. This will prevent conduction between the substrate 11 and the metal substrate, and will allow any heat generated from the semiconductor light sources 12 to be efficiently dispersed without any short circuiting between the semiconductor light sources 12. More specifically, it can be formed from silicone rubber or the like. Its thickness, shape, size, and so forth can be suitably adjusted after taking into account the size, shape, and so forth of the lighting unit that is to be obtained, but preferably it will have substantially the same shape and size as the substrate 12.

There are no particular restrictions on the semiconductor light sources 12 as long as they are semiconductors capable of emitting light, and any type that is used in this field can be used here. The semiconductor light sources 12 may be semiconductor element chips themselves, or may be a semiconductor light emitting device covered with a package, covering member, or the like. In the latter case, the constituent members may contain a wavelength converting member (such as fluorescent materials), a diffusing agent or the like, and a plurality of semiconductor element chips may be installed. In particular, if a full-color semiconductor light emitting device corresponding to RBG is used, then color mixing can be improved over that when a light emitting element of a single color is used.

Also, the semiconductor light sources 12 preferably have a substantially Lambert light distribution when viewed from above the substrate. This results in a lighting unit with even brightness, high efficiency, and little glare. Furthermore, the semiconductor light sources 12 are preferably disposed equidistantly on the substrate 11. This affords a more uniform light distribution, and also affords a more uniform distribution of heat generated from the semiconductor light sources 12.

The light reflector 13 in this embodiment has side faces and a rear face. The rear face portion is disposed along the long side of the substrate 11 on which the semiconductor light sources 12 are installed, and extends up above the semiconductor light sources 12. The side faces of the light reflector 13 are fixed to the side faces of the substrate 11. The rear face portion of the light reflector 13 has a multi-reflector 13a in which a plurality of small pieces is combined to reflect light rays 15 as shown in FIG. 1B.

The light reflector 13 in this embodiment has a multi-reflector 13a in which small pieces with a slender shape and substantially the same length as the long side of the substrate 11 are combined in the up and down direction over the entire surface of the light reflector 13, but the shape and surface area of the individual small pieces can be adjusted as desired according to the extent of the region to be illuminated, the distance to this region, and the angle of light incidence with respect to this region.

The layout angle of the small pieces is preferably adjusted so that light from the semiconductor light sources can be taken out as reflected light having different optical axes. This affords a lighting unit with which uniform illumination can be obtained over a wide range.

It is also preferable if the farther away a small piece is disposed from the semiconductor light sources, the larger is its surface area and the longer is its focal distance. If the multi-reflector is configured in this way, small pieces disposed farther away from the semiconductor light sources 12 will concentrate their illumination on more remote locations, and small pieces disposed closer to the semiconductor light sources 12 will concentrate their illumination more nearby, allowing a lighting unit to be obtained with which a wider range can be illuminated uniformly. For example, if a lighting unit thus configured is attached to the uppermost front part of a multi-level open showcase, and the inside the case is illuminated, it will be possible to uniformly illuminate not only the upper shelves, but also the lower shelves. Consequently, with a multi-level open showcase, there is no need to attach lighting for each shelf in the case, and this greatly lowers the cost. Also, using semiconductor light source reduces the operating cost and maintenance cost.

If semiconductor light sources in which brightness and color unevenness affect illumination unevenness are used, the small pieces are preferably such that the light reflecting faces of the multi-reflector have undergone processing that gives a diffusing effect.

It is also preferable if the light reflecting faces of the small pieces are spherical or aspherical (parabolic, ellipsoid, etc.) faces that converge the light of the semiconductor light sources 12, and the shape of the multi-reflector 13a obtained by adjust the layout angles of these small pieces is a cylindrical mirror shape in which the semiconductor light sources 12 are the focal point. The result of this is a lighting unit with which the light emitted from the semiconductor light sources 12 is efficiently converged so that there is a uniform luminosity distribution over the desired range in the short-side direction, and brightness and color are even over a wide range in the long-side direction. Also, the multi-reflector 13 may have a defocusing mirror shape whose focal point is the semiconductor light sources 12, and this improves the evenness of brightness and color of the semiconductor light sources 12.

The light reflector 13 can be the product of applying a metal film with high optical reflectivity by vapor deposition or plating to a resin molding made of ABS, polycarbonate, acrylic, or the like, or the product of applying a metal film with high optical reflectivity by vapor deposition or plating to a stamping of aluminum or another metal, or the product of stamping an aluminum sheet or the like that has had a highly reflective film formed on it, for example. If semiconductor light sources 12 in which brightness and color unevenness affect illumination unevenness are used, the light reflecting faces have preferably undergone processing that gives a diffusing effect.

Embodiment 2

Figure 2:
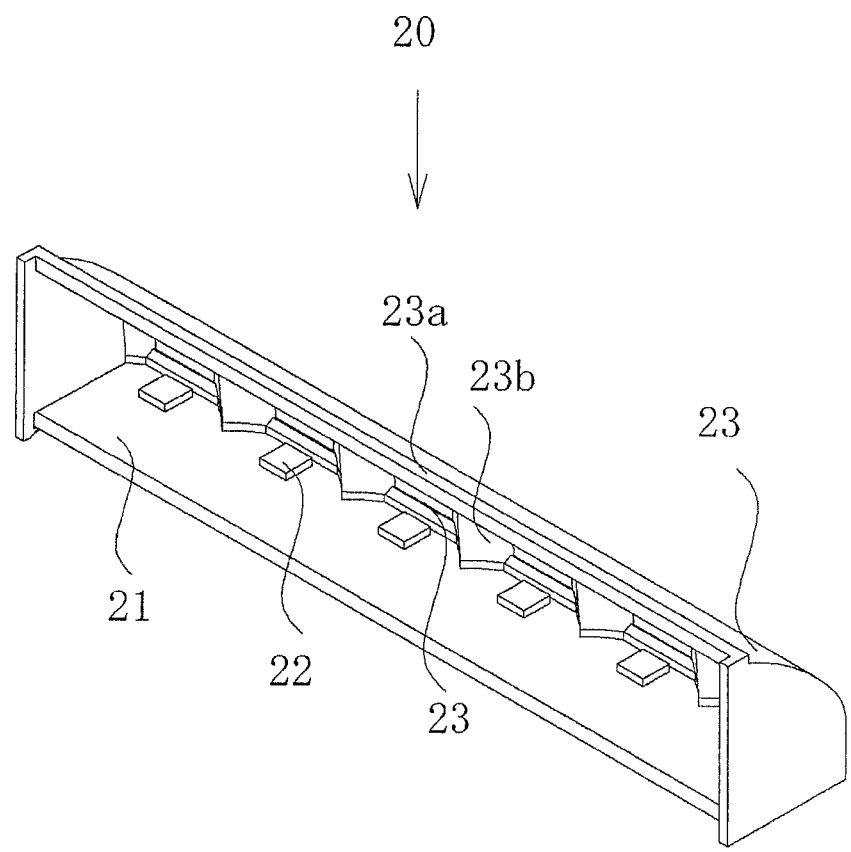
FIG. 2 is a schematic oblique view from the upper face side of another light unit according to a present invention.

As shown in FIG. 2, the lighting unit 20 in Embodiment 2 has substantially the same constitution as that in Embodiment 1, except that a light reflector 23 includes a multi-reflector 23a that is separated between a plurality of semiconductor light sources 22, and side reflectors 23b that are provided in these separated portions.

In this embodiment, a plurality of multi-reflectors 23a and a plurality of semiconductor light sources 22 are disposed opposite one another. Consequently, the light from the semiconductor light sources 22 can be taken out efficiently by the multi-reflectors 23a, and the light is utilized more efficiently. Also, the light reflector in this embodiment has the side reflectors 23b that stick out between the semiconductor light sources 22 from between the multi-reflectors 23a. Thus using a light reflector having side reflectors that stick out between a plurality of semiconductor light sources allows the light that is not utilized in the lengthwise direction to be efficiently taken out to the light take-out side in the short-side direction of a substrate 21.

Embodiment 3

The lighting device 100 in Embodiment 3 is such that two lighting units 30, each of which has a metal plate 34, a substrate 31 on which semiconductor light sources 32 are installed, and a light reflector 33, are arranged in the lengthwise direction of the substrates 31, and are held in a housing 101.

The metal plate 34 is constituted by a metal material with high thermal conductivity, such as aluminum, copper, iron, or stainless steel. The shape of the metal plate is not limited to that of a plate, and may instead be in the form of a finned heat sink, or a shape that serves as part of the structural mechanism of the housing.

In Embodiment 3, the semiconductor light sources 32 and the substrate 31 on which they are installed can be the same as those used in Embodiments 1 and 2. The light reflector is a light reflector 33 that has substantially the same configuration as the light reflector used in Embodiment 2, except that it has long ribs 33c disposed in the lengthwise direction on the outside of the rear face, and has catches 33d under the side faces. The metal plates 34 joined with the substrates 31 are supported on the catches 33d of the light reflector 33. With the lighting units 30 fixed in this manner, the ribs 33c of the light reflector 33 are fitted into openings on the rear face side of the housing 101, and the ends of the light reflector 33 and the ends of the housing 101 are fixed by holders 102.

The housing 101 has a bottom face, side faces, and a rear face, and supports the lighting units 30. There are a plurality of long ribs 101a that support the metal plate 34 in the short-side direction on the inside of the bottom face of the housing 101. Consequently, the lighting units 30 can be stably supported without hindering the heat dispersal of the metal plates 34. On the side faces of the housing 101 there are convex components having the same shape at locations corresponding to the convex components provided to the ends of the metal plates, and the convex components of the housing 101 and the convex components of the metal plates joined with the lighting units 30 are fixed by the holders. Also, on the rear face of the housing 101 there are openings that match up with the ribs 33c of the light reflector 33, and flanges that support above the rear face of the light reflector 33. With a constitution such as this, the lighting units can be simply and easily attached to the housing without having to use any separate screws or other such fasteners.

There are no particular restrictions on the holders 101 as long as that can support the convex components sticking out from the ends of the light reflector 33 and the convex components sticking out from the ends of the housing 101. Nor are there any particular restrictions on the fixing holders as long as they are some type that has been commonly used in the past.

Embodiment 4

Figure 3:
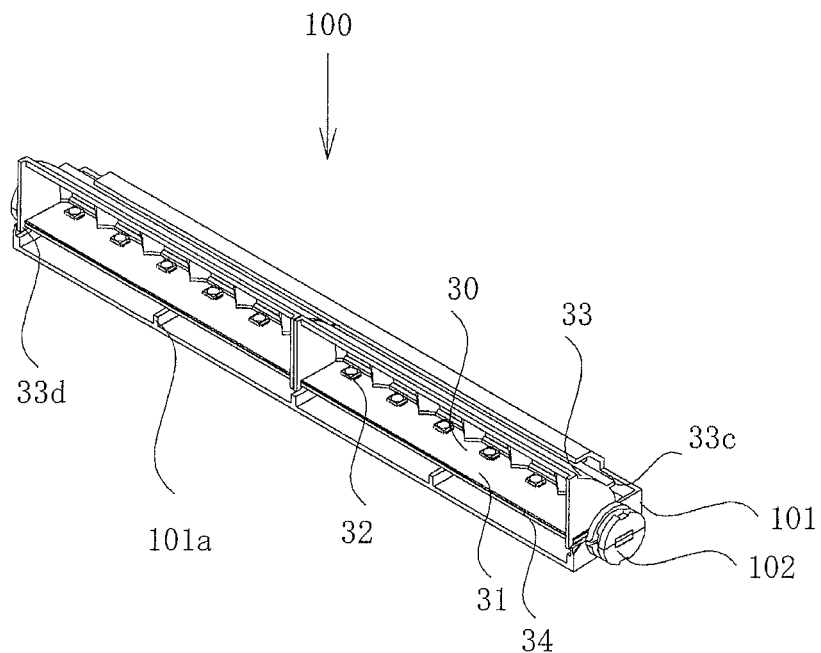
FIG. 3 is a schematic oblique view from the upper face side of still another light unit according to a present invention and lighting device using the same.
Figure 4:
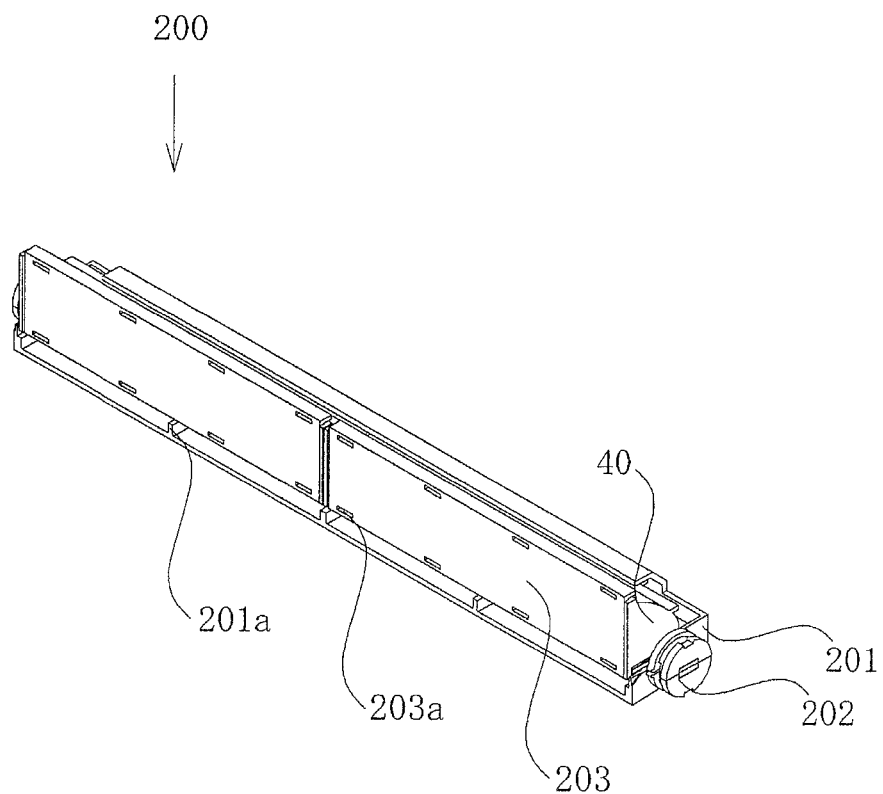
FIG. 4 is a schematic oblique view from the upper face side of still another light unit according to a present invention and lighting device using the same.

As shown in FIG. 4, the lighting device 200 of Embodiment 4 is substantially the same as that in Embodiment 3, except that it comprises a cover 203 having a light diffusing effect on the light take-out side of each lighting unit. Thus providing the covers 203 having a light diffusing effect on the other substrate long side opposite the long side where the light reflector is disposed allows a lighting unit and a lighting device to be obtained with which illumination unevenness can be suppressed even when using semiconductor light sources with which brightness and color unevenness affect this illumination unevenness. As shown in FIG. 4, the lighting device 200 includes a plurality of ribs 201a and a holder 202 that respectively correspond to the ribs 101a and the holder 102 shown in FIG. 3.

There are no particular restrictions on the covers 203 as long as they are made of a material capable of transmitting the light from the semiconductor light sources, and any material known in this field can be used, but a lightweight and strong plastic is preferable, and particularly when workability and heat resistance are taken into account, a resin material such as a polycarbonate or acrylic is preferable. The optical transmissivity referred to in this Specification is preferably such that 100% of the light from the installed semiconductor light sources 13 is transmitted, but when color mixing, color unevenness, and so forth are taken into account, this concept encompasses semitransparent and opaque materials (such as those that are milky white in color and have an optical transmissivity of about 50% or higher).

The term "light diffusing effect" here refers to the point that can diffuse light from the semiconductor light sources, and the covers themselves may be given a light diffusing effect, or another member having a light diffusing effect may be combined with the covers 203. For example, a diffuser sheet (such as a thin sheet made of a semitransparent or milky white resin) may be stuck onto the front face side and/or the rear face side (inside) of the covers 203, or the front and/or rear face side of the covers may be sandblasted, ground, or otherwise subjected to a roughening treatment. Furthermore, a diffusing agent (such as silicon oxide or other such filler) may be added to the material that makes up the covers 203. This allows the light from each semiconductor light source to be a uniform, single planar light source.

The covers 203 are equipped with attachment components 203a that can be removably fitted to the lighting units 40, around the edge on the rear face side of the light observation face. The attachment components 203a are preferably disposed at locations that will not adversely affect light emission from the semiconductor light sources 13.

The attachment components 203a are preferably formed integrally with the covers 203 and from the same material as the covers 203. This reduces the number of parts of the lighting device, lowers the cost, and allows easier assembly.

The lighting units 40 of this embodiment are sealed by the covers 203, so they can be used in places where there is the possibility of frost, such as in a refrigerator.

The lighting unit of the present invention can be utilized in various lighting applications, including multi-level open showcase lighting, as well as sign lights, architectural lighting, and so forth.

The invention claimed is:

1. A lighting unit comprising:
a slender substrate;
a plurality of semiconductor light sources arranged in a row in a lengthwise direction on the substrate; and
a light reflector disposed along one long side of the substrate and extending over the semiconductor light sources, the light reflector having a multi-reflector in which a plurality of small pieces is combined in an up and down direction, each of the small pieces having a light reflecting face that is spherical or aspherical to converge light from the semiconductor light sources, the small pieces being arranged so that a surface area of the small piece is larger and a focal distance of the small piece is longer as a distance between the small piece and the semiconductor light sources is larger, with a focal point of the small pieces being located at a position corresponding to the semiconductor light sources, layout angles of the plurality of small pieces being arranged so that the light from the semiconductor light sources is taken out as reflected light beams having different optical axes that are not parallel to each other to illuminate an entire area of a prescribed range in the up and down direction, wherein
each of the semiconductor light sources includes a semiconductor element chip covered with a covering member including a fluorescent material.

2. The lighting unit according to claim 1, wherein
the light reflector has side reflectors that protrude between the plurality of semiconductor light sources.

3. The lighting unit according to claim 1, further comprising
a cover that has a light diffusing effect, on another long side of the substrate.

4. The lighting unit according to claim 1, wherein
the light reflector has side reflectors that protrude between the plurality of semiconductor light sources.

5. The lighting unit according to claim 4, further comprising
a cover that has a light diffusing effect, on another long side of the substrate.

6. The lighting unit according to claim 1, wherein
the lighting unit is attached to an uppermost front part of a multi-level open showcase.

7. The lighting unit according to claim 1, wherein
the light reflecting faces of the small pieces have undergone processing such that the light reflecting faces give a light diffusing effect.

8. The lighting unit according to claim 1, wherein
the light reflector is the product of applying a metal film with high optical reflectivity by vapor deposition or plating to a resin molding made of ABS, polycarbonate, acrylic.

9. The lighting unit according to claim 1, wherein
the light reflector is the product of applying a metal film with high optical reflectivity by vapor deposition or plating to a stamping of aluminum, or the product of stamping an aluminum sheet that has had a highly reflective film formed thereon.

10. The lighting unit according to claim 1, wherein
the semiconductor light sources have a substantially Lambert light distribution when viewed from above the substrate.

11. The lighting unit according to claim 1, wherein
a metal substrate is joined to a bottom face side of the substrate by an intermediary of a thermally conductive sheet having thermal conductivity of 1 W/(m' K) or higher.

* * * * *